United States Patent

Tsurumi

Patent Number: 5,763,962
Date of Patent: Jun. 9, 1998

[54] SEMICONDUCTOR SWITCH DRIVING CIRCUIT

[75] Inventor: Keiichi Tsurumi, Akiruno, Japan

[73] Assignee: ECG Co., Ltd., Tokyo, Japan

[21] Appl. No.: 684,303

[22] Filed: Jul. 18, 1996

[30] Foreign Application Priority Data

Sep. 22, 1995 [JP] Japan .................. 7-269181

[51] Int. Cl.$^6$ .................................. H03K 17/04
[52] U.S. Cl. .................. 307/129; 327/377; 327/389; 327/482; 307/139; 307/140; 326/17; 326/18
[58] Field of Search .................. 307/17, 104, 106, 307/116, 125, 129, 130, 131, 139, 140; 327/100, 103, 108, 113, 124, 165, 168, 181, 190, 382, 389, 390, 374, 376, 377, 427, 419, 429, 430, 431, 434; 326/17, 18

[56] References Cited

U.S. PATENT DOCUMENTS

| 4,052,623 | 10/1977 | Loberg | 327/482 |
|---|---|---|---|
| 4,481,434 | 11/1984 | Janutka | 327/377 |
| 4,492,883 | 1/1985 | Janutka | 327/377 |
| 4,500,801 | 2/1985 | Janutka | 327/377 |
| 4,877,982 | 10/1989 | Walker | 327/482 |
| 4,888,504 | 12/1989 | Kinzer | 327/377 |
| 5,467,047 | 11/1995 | Robb | 327/377 |
| 5,475,329 | 12/1995 | Jones et al. | 327/377 |
| 5,481,219 | 1/1996 | Jacobs et al. | 327/377 |
| 5,530,298 | 6/1996 | Gerhold | 307/106 |
| 5,578,862 | 11/1996 | Fujii et al. | 327/482 |
| 5,612,562 | 3/1997 | Siaudeau et al. | 327/389 |

Primary Examiner—William M. Shoop, Jr.
Assistant Examiner—Peter Ganjian
Attorney, Agent, or Firm—McGlew and Tuttle

[57] ABSTRACT

A high-voltage semiconductor driving circuit to be instantaneously operated for the duration of an arbitrary pulse width can be effectuated through an extremely simple circuit configuration.

The circuit comprises a pulse transformer (2) which receives an input pulse signal and generates a pulse voltage, a diode (3) which conducts the pulse voltage to the capacitive gate electrode of the high-voltage semiconductor switching element (5), and another switching element (4) which is connected in parallel to the diode (3) and adapted to discharge, at the falling of the pulse voltage, the gate capacitance which has been charged at the rising of the pulse voltage.

7 Claims, 4 Drawing Sheets

SEMICONDUCTOR SWITCH DRIVING CIRCUIT

FIELD OF THE INVENTION

The present invention relates to a semiconductor switch driving circuit which is capable of switching high-voltage at an interval of an arbitrary pulse width and is useful for e.g. a high voltage application circuit of an impulse coil test equipment which tests the quality of coils based on the application of high voltage.

BACKGROUND OF THE INVENTION

There have been practiced thyristors, MOSFETs, IGBTs and others for use as high-voltage semiconductor switching elements, which have withstand voltage of 1500 V at most in general. Accordingly, a plurality of the above semiconductor switching elements are connected in series for the need of switching of higher voltage. The performance of the switching of the elements depends largely on as to how to evenly drive their gate electrodes and how to ensure the insulation among the elements.

Specifically, in case of configuring a switch driving circuit having a voltage of 5 KV or higher, a method has been widely proposed in which semiconductor switching elements are driven by means of pulse transformers having ferrite ring cores which facilitate the insulation and serial connection of the elements.

FIG. 4 shows a conventional semiconductor switch driving circuit formed of multiple sets of thyristors as semiconductor switching elements and ferrite ring cores. In the figure, a current flowing out of a power source 10 over a primary conductor 15 is fed through two pulse transformers 11 with ring cores by being switched on and off by a transistor 12, resulting in a pulse current. Each pulse transformer 11 generates on its secondary winding a pulse voltage that depends in amplitude on the turn ratio of coils, and the pulse voltage triggers a thyristor 13, which then enters the conductive state instantaneously.

Accordingly, the thyristor 13 as a high-voltage semiconductor switching element can be used for switching of higher voltage by being connected in series as a set, and the insulation among the elements can readily be accomplished by use of a high insulation cable for the primary conductor 15. The kind of switching elements connected to the primary conductor 15 may include a thyristor and a power MOSFET besides the transistor 12 as shown in the Figure.

The turn-off operation of the thyristor 13 in the conductive state is dependent on it s characteristics, and the thyristor 13 is turned off when a high-voltage current is swept away and the load current subsides to a virtually zero level. Resistors 14 are used to equalize each share of voltage among the thyristors 13.

FIG. 5 shows another conventional semiconductor switch driving circuit that employs power MOSFETs or IGBTs 23 for the high-voltage switching elements. Also in this example, a switching transistor 22 connected by cutting in a primary conductor 25 from a power source 20 is turned on and off thereby to generate a pulse voltage on the secondary windings of pulse transformers 21. By using the power MOSFET or IGBT 23 for the high-voltage semiconductor switching element, as shown in the Figure, such a semiconductor switching element is made to conduct the load current for the duration of the pulse width. The pulse width, which is derived from a pulse width of an input pulse signal applied to the base of the transistor 22, is limited by the characteristics of the pulse transformer 21.

The power MOSFETs or IGBTs 23 can readily be connected in series and insulated from each other, as in the case of FIG. 4. Resistors 24 are used to equalize each share of voltage among the switching elements.

FIG. 6 shows a modified version of the circuit arrangement shown in FIG. 5, in which the input pulse signal 34 is modulated by a high-frequency clock signal 35 by means of an AND gate 33 so that a primary current having a clock waveform shown by 36 are fed through the pulse transformers 31.

Consequently, each pulse transformer 31 generates on its secondary winding a clock pulse voltage that depends on the turn ratio, and each of gate circuits 39 including a rectifying circuit and reset circuit demodulates the clock pulse voltage thereby to restore the original waveform of the pulse signal 34 and applies the demodulated signal to the gate electrode of the power MOSFET or IGBT 34. The input clock signal has a practical frequency of the order of several mega-Hertz.

In this example, the pulse transformers 31 need to have satisfactory transfer characteristics only for the clock signal frequency, and are rid of the upper limit of the pulse width imposed on the characteristics of the pulse transformers 21 thereby obtaining an arbitrary width as shown in the example of FIG. 5.

However, the conventional semiconductor switch driving circuits shown in FIG. 4 and FIG. 5 have a problem that the duration of load current conduction cannot be set arbitrarily. Specifically, in the example of FIG. 4, it is infeasible to bring the switching elements to the cutoff state during the high-voltage current conduction, and this circuit arrangement further necessitates an awkward operation for turning off the high-voltage power source after the high-voltage current has subsided in order to ensure their cutoff state.

In the example of FIG. 5, the pulse transformers 21 to be fast operated must be designed to have satisfactory high frequency transfer characteristics, resulting in degraded low frequency transfer characteristics on the other hand, and therefore the use of this circuit arrangement is confined due to the restricted duration of load current conduction.

Although the example of FIG. 6 overcomes the above-mentioned problems, the circuit arrangement is complex, which is undesirable from the viewpoints of economy and reliability of high-voltage treatment. Moreover, although the gate circuits 39 formed of usual IC elements have been practiced for their easy configuration, the 5-volt IC power voltage determines the upper limit of the gate voltage of the switching elements 37, and the latitude in choosing high-voltage switching elements 37 is confined.

SUMMARY OF THE INVENTION

The present invention is intended to solve the foregoing prior art problems, and its object is to provide a semiconductor switch driving circuit which is simple in arrangement and yet is capable of fast operating a high-voltage semiconductor switching element(s) at an interval of an arbitrary pulse width.

A semiconductor switch driving circuit comprises a first switching element which turns on and off to allow a current to flow through a primary conductor in accordance with the timing of an input pulse signal, a high-frequency pulse transformer which responds to the pulse current flowing through the primary conductor to induce on its secondary winding a pulse voltage that depends in amplitude on the turn ratio of the transformer, a high-voltage semiconductor switching element which is connected by cutting in a high-voltage load circuit and connected to receive the pulse voltage generated by the pulse transformer on its gate having a property of a capacitive load by way of a diode, and a second switching element which is connected in parallel to the diode and adapted to discharge, at the falling of the pulse voltage, the gate capacitance which has been charged at the rising of the pulse voltage.

A semiconductor switch driving circuit comprises a plurality of the high-voltage semiconductor switching elements connected in series by cutting in a high-voltage load circuit.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
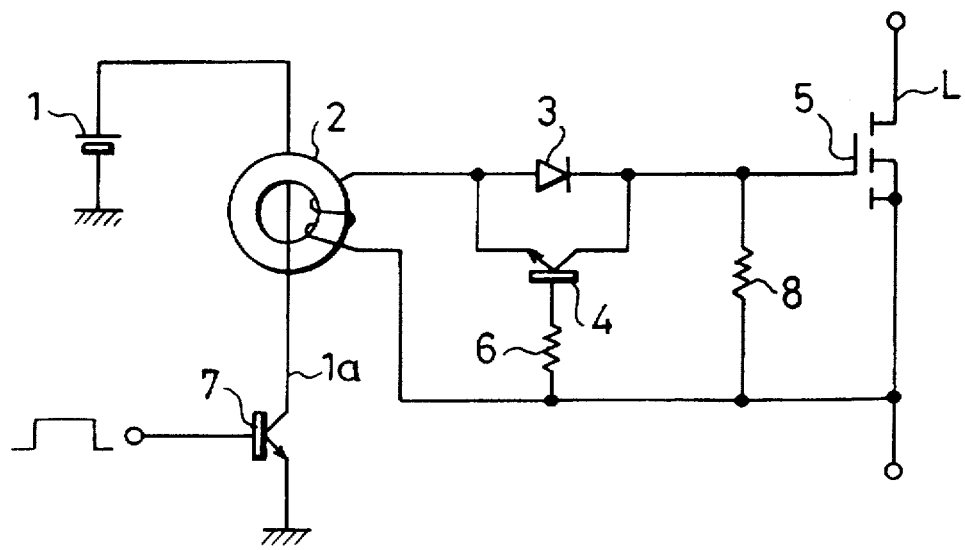
FIG. 1 is a schematic diagram of the semiconductor switch driving circuit based on an embodiment of this invention.

An embodiment of this invention will be explained with reference to the drawings. In FIG. 1, reference numeral 1 denotes a d.c. power source, 1a is a primary conductor connected to the power source 1, and 7 is a transistor as the first switching element connected by cutting in the primary conductor 1a and adapted to receive a switching pulse signal on its base.

Indicated by 2 is a pulse transformer with a ring core, with the primary conductor running through it, and is designed to be highly responsive to the rising and falling of the primary pulse current. The pulse transformer 2 has a secondary winding, with its one end connected by way of a diode 3 to the gate of a MOSFET 5 as the high-voltage semiconductor switching element which is connected by cutting in a high-voltage locate circuit L. The gate of the MOSFET 5 (or IGBT as an alternative high-voltage semiconductor switching element) has a property of a capacitive load which is charged by the rising pulse current from the pulse transformer 2.

Indicated by 4 is an npn-type transistor as the second switching element in anti-parallel connection with the diode 3. The transistor 4 has its base connected by a resistor 6 to another end of the secondary winding of the pulse transformer 2, which end is also connected to the source of the MOSFET 5. Indicated by 8 is a resistor connected between the gate and source of the MOSFET 5, and it serves to stabilize the gate voltage of the MOSFET 5.

Next, the operation of this circuit arrangement will be explained. A pulse current as shown by (a) in FIG. 2 originating from the power source 1 is fed by the transistor 7 to the primary conductor 1a which runs through the pulse transformer 2, as in the case of the conventional circuit arrangement. The pulse transformer 2 is designed to transfer intensively the rising and falling sections of the pulse current, producing a pulse value with a differentiated current waveform on the secondary winding of the pulse transformer 2 as shown by (b) in FIG. 2.

The rising or positive peak current indicated by 1 quickly charges the gate capacitance of the MOSFET 5 by way of the diode 3, causing the MOSFET 5 to enter the conductive state. Since the MOSFET 5 has an extremely small gate leak current, the pulse signal has its peak voltage virtually retained by the gate capacitance, resulting in a continuous conductive state of the MOSFET 5 as shown by 3 on the waveform (c) of FIG. 2.

Figure 2:
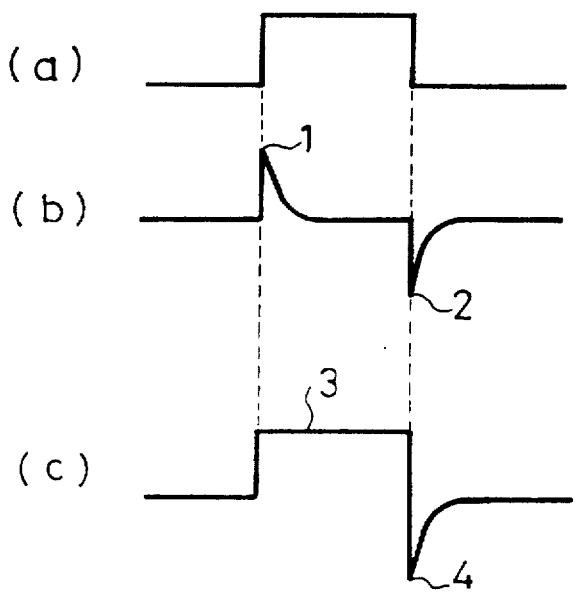
FIG. 2 is a waveform diagram showing the waveforms of signals at various portions of the circuit of FIG. 1.

The falling or negative peak current indicated by 2 on the waveform (b) of FIG. 2 causes the npn-type transistor 4 to have a positive base voltage against the emitter, resulting in the collector-to-emitter conduction. Consequently, the gate capacitance of the MOSFET 5 is discharged quickly. At this time, the transistor 4 has a negative emitter voltage as shown by (b) in FIG. 2, causing the MOSFET 5 to have its gate voltage falling sharply, creating a negative peak voltage as shown by 4 on the waveform (c) of FIG. 2. Although this negative peak voltage can readily be removed, if intended, by means of a clamping diode for example, this waveform is rather suitable for quickly cutting off the MOSFET 5, and it is an ideal drive signal for the MOSFET 5 derived from the input pulse signal of an arbitrary pulse width shown by (a) in FIG. 2.

The resistor 6 has preferably its resistance determined from the viewpoint of supplying a base current of the differentiated falling waveform enough to bring the transistor 4 to the conductive state. The resistor 8 should have its resistance determined such that it maintains the gate voltage of the MOSFET 5 stable during the off period of the input pulse signal and the gate voltage does not fall too low during the active period (indicated by 3 on the waveform (c) of FIG. 2) even for the maximum pulse width.

Figure 3:
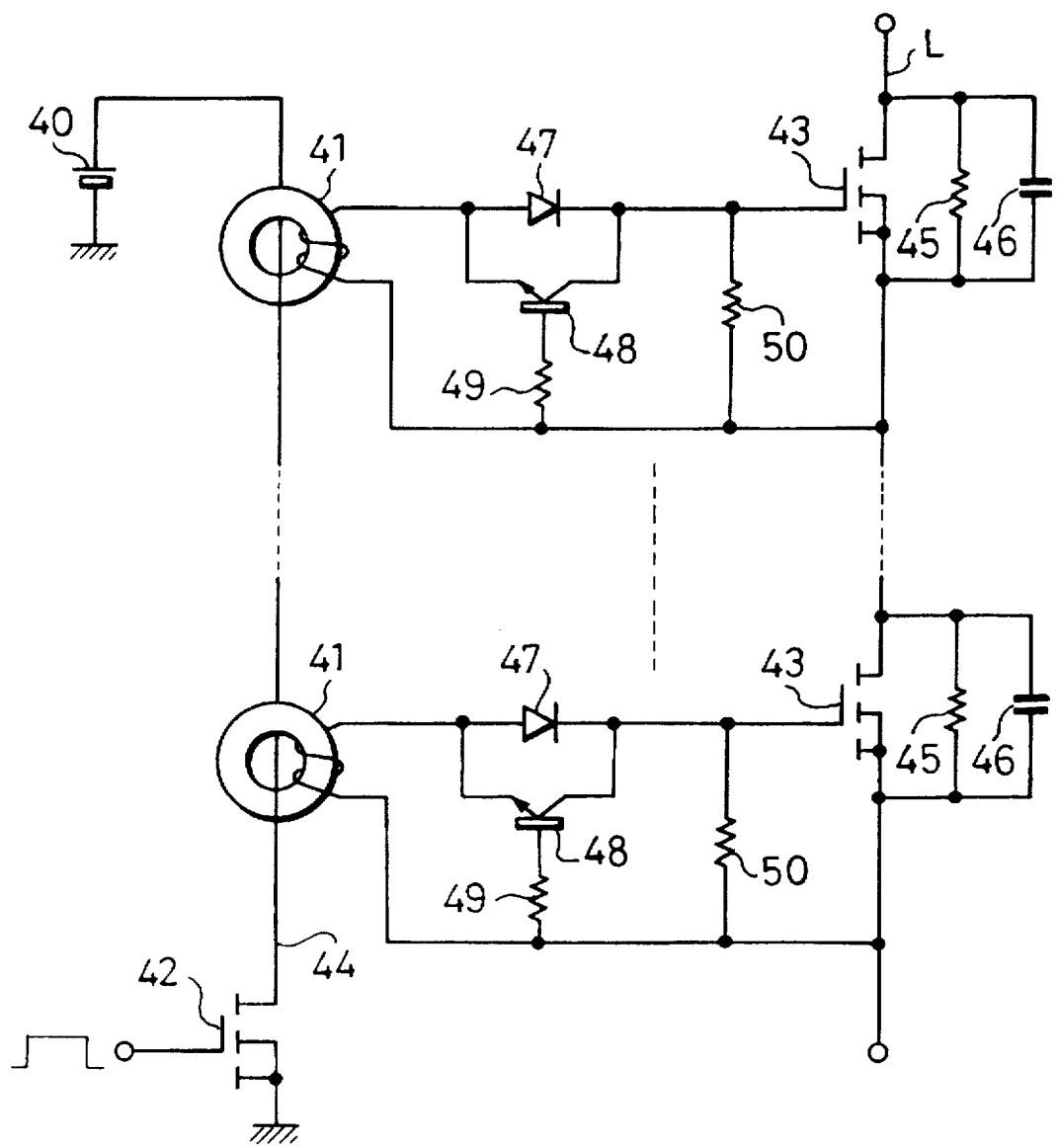
FIG. 3 is a schematic diagram of the semiconductor switch driving circuit based on another embodiment of this invention.
Figure 4:
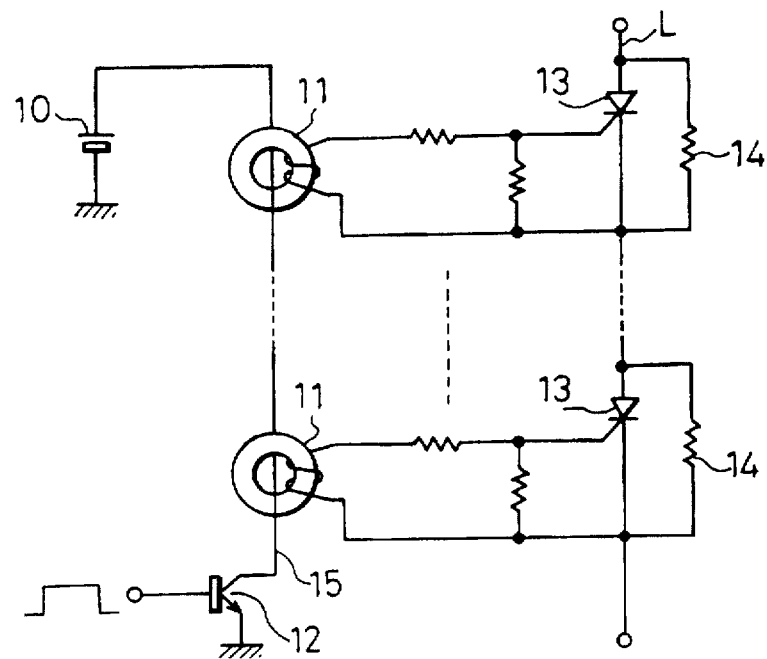
FIG. 4 is a schematic diagram of a conventional semiconductor switch driving circuit.
Figure 5:
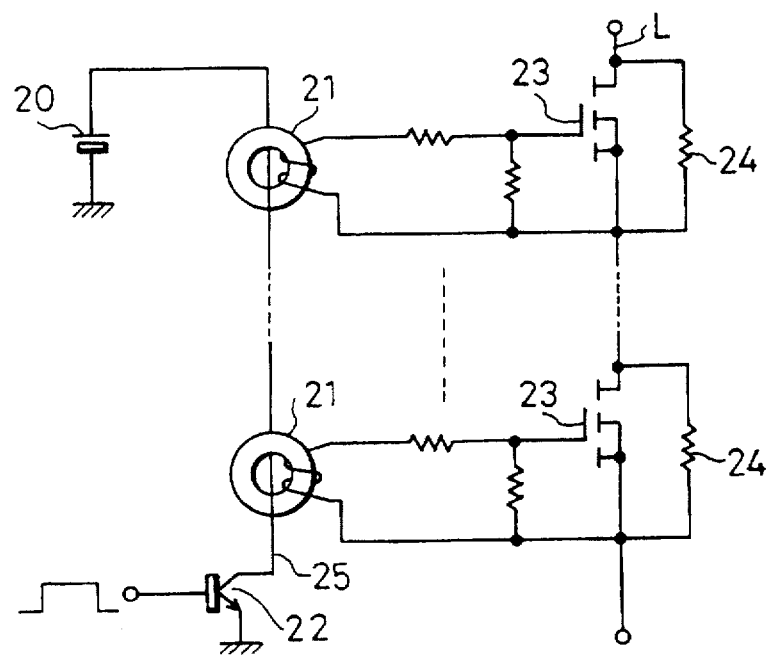
FIG. 5 is a schematic diagram of another conventional semiconductor switch driving circuit.
Figure 6:
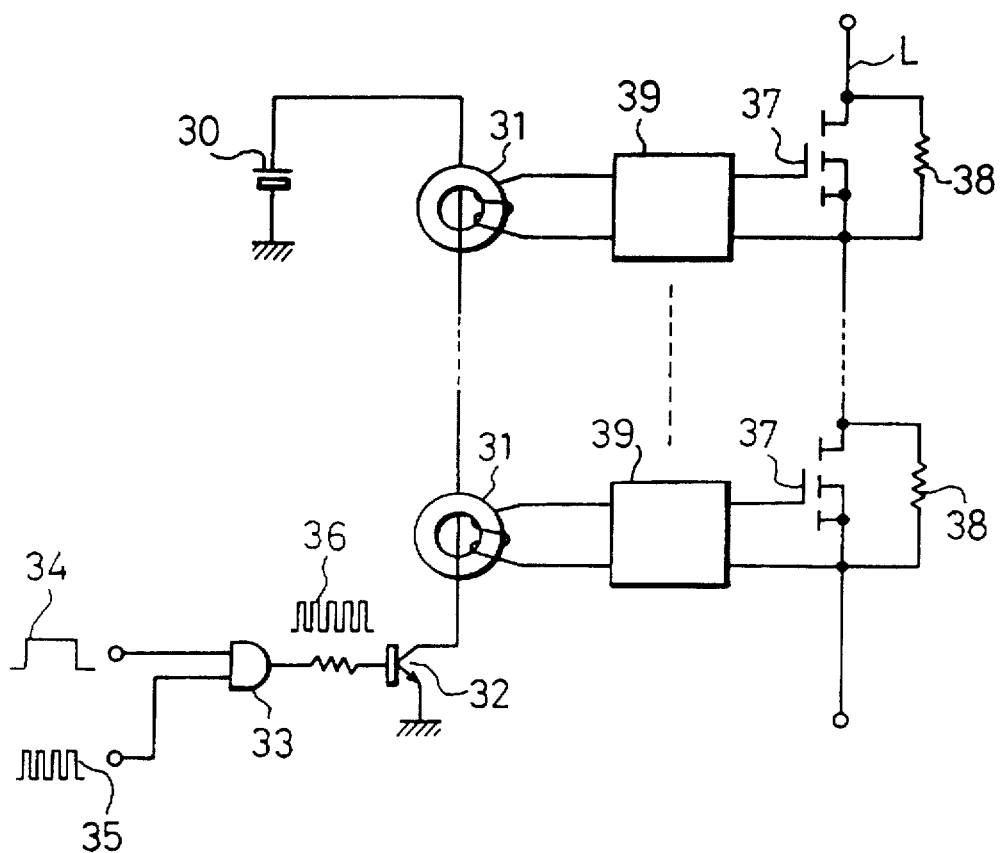
FIG. 6 is a schematic diagram of still another conventional semiconductor switch driving circuit.

FIG. 3 shows another embodiment of this invention. In the circuit arrangement, a plurality of pulse transformers 41 with ferrite ring cores are used in the same manner as the conventional circuit arrangement in order to facilitate the serial connection of multiple MOSFETs 43 as the high-voltage semiconductor switching elements.

For the switching element for feeding a pulse current to the primary conductor 44 of the pulse transformers 41, a MOSFET 43 of large current rating that operates fast in response to a falling pulse signal is used in this embodiment, although a bipolar transistor may also be used. A resistor 45 connected across each MOSFET 43 is intended to equalize each share of voltage among all MOSFETs, and a capacitor 46 is connected parallel to it in order to share a fast varying voltage across the switching circuit.

The voltage needed to drive the gate of the MOSFET 43 ranges from 10 to 15 V in general. Therefore, the gate charging diode 47 can be a silicon diode for small signals, and the gate discharging transistor 48 as the second switching element can be an non-type transistor for small signals for the accomplishment of fast operation. The transistor 48 may be replaced with an FET when necessary.

The circuit arrangement of this embodiment is capable of switching a high-voltage current stably at an interval of a pulse width ranging from about 2 microseconds to about 100 milliseconds. This pulse width range does not signify the limit of this circuit arrangement, but it can be extended when necessary by connecting capacitors in parallel to the gates thereby to increase the gate capacitance of the MOSFETs 43, which enables the switching of long duration.

Further included in the circuit arrangement are resistors 49 having a certain resistance for bringing the transistors 48 to the conductive state in response to the differentiated falling pulse signal, resistors 50 for stabilizing the gate voltage of the MOSFETs 43, and a MOSFET 42 as the first switching element.

As explained above in detail, the inventive semiconductor switch driving circuit comprises a first switching element which turns on and off to allow a current to flow through a primary conductor in accordance with the timing of an input pulse signal, a high-frequency pulse transformer which responds to the pulse current flowing through the primary conductor to induce on its secondary winding a pulse voltage that depends in amplitude on the turn ratio of the transformer, a high-voltage semiconductor switching element which is connected by cutting in a high-voltage load circuit and connected to receive the pulse voltage generated by the pulse transformer on its gate having a property of a capacitive load by way of a diode, and a second switching element which is connected in parallel to the diode and adapted to discharge, at the falling of the pulse voltage, the gate capacitance which has been charged at the rising of the pulse voltage.

Accordingly, a semiconductor switch driving circuit which operates fast at an interval of an arbitrary pulse width can be accomplished in a very simple circuit arrangement. Thus, the high-accuracy impulse coil test in which the quality of high-voltage impulse currents is examined based on response waveforms gained through coils to which the currents are applied can be effectuated, and in addition the application of the high-voltage currents at an interval of an ideal pulse width can be widely facilitated according to the kind of coils and the object of tests.

The inventive semiconductor switch driving circuit having a transistor as the second switching element, which simplifies the circuit arrangement and facilitates the timing design, can be used suitably with the switch for high-voltage discharging in a painting machine or film winding machine that bases the operation on the high electrostatic voltage application.

Furthermore, the inventive semiconductor switch driving circuit formed of a plurality of the high-voltage semiconductor switching elements connected in series can perform arbitrarily and safely the switching of a high-voltage load circuit having a voltage in excess of the withstand voltage of individual high-voltage semiconductor switching elements such as MOSFETs.

While specific embodiments of the invention have been shown and described in detail to illustrate the application of the principles of the invention, it will be understood that the invention may be embodied otherwise without departing from such principles.

What is claimed is:

1. A semiconductor switch driving circuit comprising:
   a first switching element which turns on and off to allow a current to flow through a primary conductor in accordance with the timing of an input pulse signal;
   a high-frequency pulse transformer which responds to the pulse current flowing through said primary conductor to induce on the secondary winding thereof a pulse voltage that depends in amplitude on the turn ratio of said transformer;
   a high-voltage semiconductor switching element which is connected by cutting in a high-voltage load circuit and connected to receive the pulse voltage produced by said pulse transformer on the gate thereof by way of a diode, said gate having a property of a capacitive load; and
   a second switching element which is connected in parallel to said diode and adapted to discharge, at the falling of the pulse voltage, said gate capacitance which has been charged at the rising of the pulse voltage.

2. A semiconductor switch driving circuit according to claim 1, wherein a plurality of said high-voltage semiconductor switching elements are connected in series by cutting in said high-voltage load circuit.

3. A switch driving circuit comprising:
   a primary conductor carrying a first pulse signal;
   a transformer means connected to said primary conductor and including a secondary winding, said transformer means generating a secondary pulse signal in response to said first pulse signal, said secondary pulse signal having a positive peak and a negative peak.
   a first switching means having a gate with a capacitive load, said gate being connected to said secondary winding of said transformer means;
   a diode positioned between said gate of said switching element and said secondary winding;
   a second switching means connected to said secondary winding and said first switching element to discharge said capacitive load of said gate upon said negative peak of said secondary pulse signal.

4. A circuit in accordance with claim 3, wherein:
   said diode charging and maintaining said capacitive load of said gate during and after said positive pulse.

5. A circuit in accordance with claim 3, wherein:
   said transformer means generates said positive pulse on a rising edge of said first pulse signal and generates said negative pulse on a falling edge of said first pulse signal;
   said secondary pulse signal being zero between said positive and negative signals.

6. A circuit in accordance with claim 3, wherein:
   said secondary pulse signal is a differentiated form of said first pulse signal.

7. A circuit in accordance with claim 3, wherein:
   said second switching means is arranged in parallel with said diode.

* * * * *